United States Patent
Kajitani

[11] Patent Number: 5,946,236
[45] Date of Patent: Aug. 31, 1999

[54] NON-VOLATILE SEMICONDUCTOR MEMORY DEVICE AND METHOD FOR WRITING INFORMATION THEREIN

[75] Inventor: Masanori Kajitani, Motosu-gun, Japan

[73] Assignee: Sanyo Electric Co., Ltd., Osaka, Japan

[21] Appl. No.: 09/049,307

[22] Filed: Mar. 27, 1998

[30] Foreign Application Priority Data

Mar. 31, 1997 [JP] Japan ................................. 9-081480
Mar. 31, 1997 [JP] Japan ................................. 9-081481

[51] Int. Cl.$^6$ ................................................. G11C 16/04
[52] U.S. Cl. ........................ 365/185.19; 365/185.18; 365/185.28; 365/185.03
[58] Field of Search .................... 365/185.05, 185.18, 365/185.19, 185.25, 185.03, 185.26, 185.28

[56] References Cited

U.S. PATENT DOCUMENTS

| | | | |
|---|---|---|---|
| 5,197,028 | 3/1993 | Nakai | 365/185 |
| 5,297,079 | 3/1994 | Ha | 365/182 |
| 5,313,432 | 5/1994 | Lin et al. | 365/230.06 |
| 5,732,022 | 3/1998 | Kato et al. | 365/185.18 |
| 5,808,939 | 9/1998 | Iwahashi | 365/185.19 |

*Primary Examiner*—David Nelms
*Assistant Examiner*—Gene N. Auduong
*Attorney, Agent, or Firm*—Loeb & Loeb LLP

[57] ABSTRACT

In order to increase the efficiency of a write operation with respect to a non-volatile semiconductor memory having a floating gate electrode, a memory cell transistor (40) is connected to a bit line (42), which is further connected to a current limitation circuit (30). The current limitation circuit (30) comprises a number of parallely connected switching transistors (31 to 34), and grounds the bit line (42). While a constant level for a write clock φW supplied via a bit line 42, remains, the switching transistors (31 to 34) are stepwise turned to thereby stepwise increase a write current IPP, allowing analog information to be written into the memory cell transistor (40).

13 Claims, 6 Drawing Sheets

NON-VOLATILE SEMICONDUCTOR MEMORY DEVICE AND METHOD FOR WRITING INFORMATION THEREIN

BACKGROUND OF THE INVENTION

1. Field of the Invention

The present invention relates to a non-volatile semiconductor memory device for storing analog data in a memory cell transistor having a floating gate electrode.

2. Description of the Related Art

An electrically erasable programmable ROM (EEPROM) comprises a number of memory cells, each in turn comprising a single transistor for recording electrically erasable information. Each transistor has a double gate electrode structure including a floating gate electrode and a control gate electrode. Data is written into such a memory cell transistor by applying hot electrons generated on the drain region side of the floating gate electrode into the floating gate electrode with acceleration, and data is read therefrom by detecting a difference in operating characteristics of the transistor between when it is and when it is not in a state where electric charges are stored in its floating gate electrode.

Figure 1:
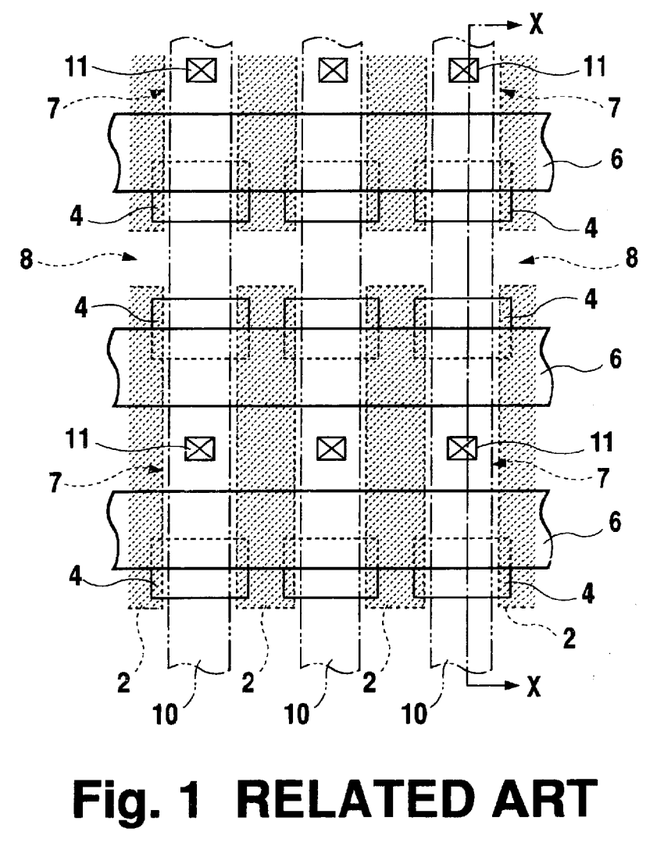
FIG. 1 is a plan view showing a structure of a memory cell of a conventional non-volatile semiconductor memory device which is also used in the present invention.
Figure 2:
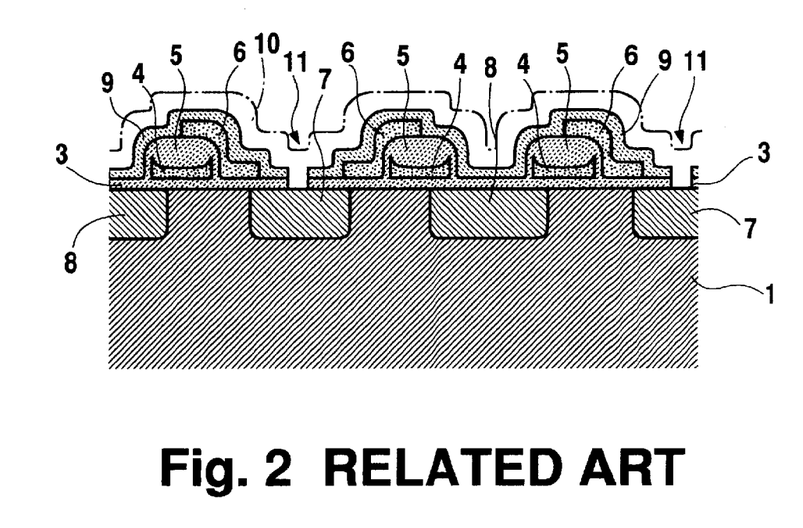
FIG. 2 is a cross sectional view of the structure along the X—X line of FIG. 1.

FIG. 1 is a plan view showing the memory cell of a non-volatile semiconductor memory device having a floating gate electrode; FIG. 2 is a cross sectional view of the device along the line X—X in FIG. 1. The memory cell shown in the drawings have a split gate electrode structure in which a control gate electrode is arranged partly overlapping with floating gate electrodes.

On the surface region of a P-type silicon substrate 1, a selectively thick oxide film (LOCOS) is formed. The film constitutes a number of rectangular isolation regions 2 to separate element regions. Floating gate electrodes 4 are formed on the silicon substrate 1 via an oxide film 3, one for each memory cell, bridging adjacent separated regions 2. A further oxide film 5 is formed on each of the floating gate electrodes 4, this film 5 being thick around the center of the gate electrode 4 and resultantly causing cusped edges of the floating gate electrode 4. With cusped edges of the floating gate electrode 4, an electric field tends to be concentrated in the vicinity of the edges in a data erasing operation.

On the silicon substrate 1 carrying a number of floating gate electrodes 4, control gate electrodes 6 are formed one for each row of the floating gate electrodes 4. Each control gate electrode 6 is formed partially overlapping with the floating gate electrodes 4 of the corresponding row, and the rest with the silicon substrate 1 via the oxide film 3. Floating gate electrodes 4 and control gate electrodes 6 are arranged plane symmetrically with respect to respective adjacent ones. Further, N-type first diffusion layers 7 are formed in the substrate region between adjacent control gate electrodes 6, while a second diffusion region 8 is formed in the substrate region between adjacent floating regions 4. First diffusion layers 7 are each discrete from one another, being sandwiched by isolation regions 2 between adjacent control gate electrodes 6. A second diffusion layer 7 continuously extends in the same direction in which the control gate electrode 6 extends. A floating gate electrode 4, a control gate electrode 6, a first diffusion layer 7, and a second diffusion layer 8 together constitute a memory cell transistor.

Above the control gate electrodes 6 via an oxide film 9, aluminum lines 10 are provided intersecting the control gate electrodes 6. Each aluminum line 10 is connected to the first diffusion layer 7, passing through an contact hole 11.

With the above-structured memory cell transistor, a resistance value between the source region and the drain region thereof varies depending on the amount of electric charges applied to the floating gate electrode 4. In other words, when electric charges are applied to floating gate electrode 4, the resistance value of the floating gate electrodes 4 are caused to vary in an analog manner. Due to this variation, a memory cell transistor presents different operation characteristics between when it is and it is not in a state where electric charges are stored therein. As the difference of the operating characteristics differs depending on the amount of applied electric charges, respective differences are set to correspond to respective information to be written into a memory cell transistor.

Figure 3:
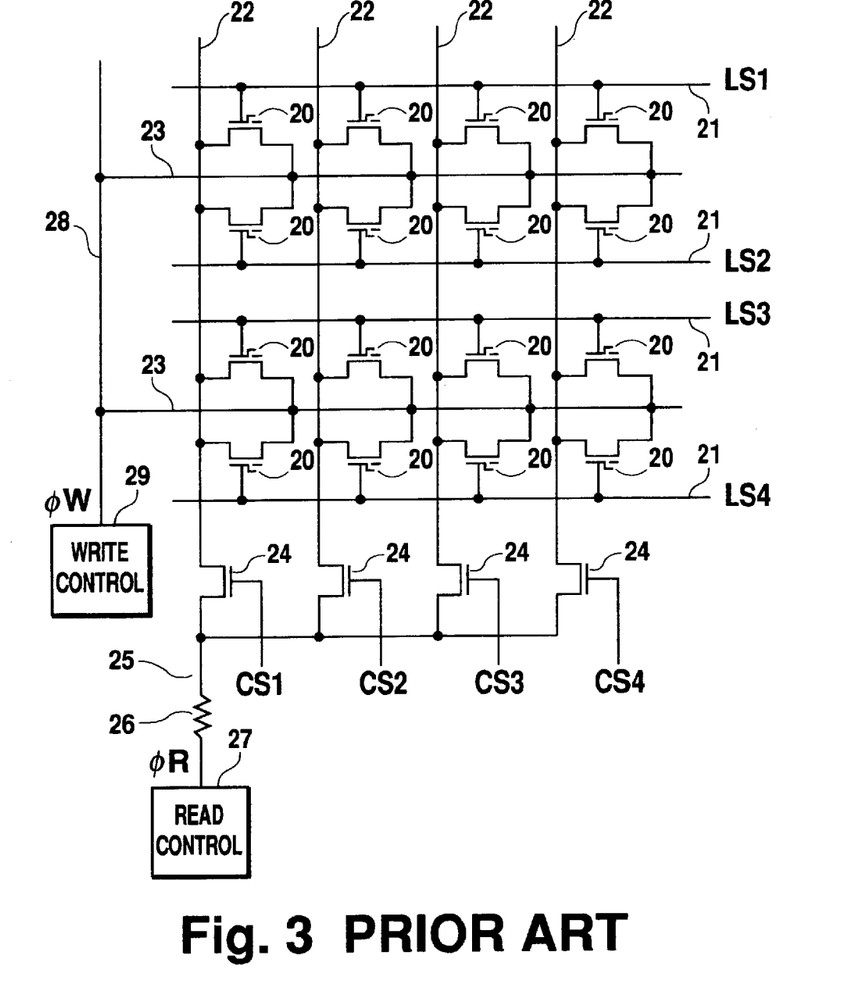
FIG. 3 is a diagram illustrating a circuit structure of a conventional non-volatile semiconductor memory.

FIG. 3 is a diagram showing the circuit of a memory cell shown in FIG. 1. In the drawing, memory cells are arranged in four rows and four columns (4×4).

A memory cell transistor 20 of a double gate electrode structure has a control gate electrode 6 connected to a word line 21, and first and second diffusion layers 7, 8 respectively connected to a bit line 22 and a source line 23. Bit lines 22 are connected via selection transistors 24 to a data line 25. The data line 25 is in turn connected via a resistor 26 to a read control circuit 27. The bit lines 22 are also connected to sense amplifiers (not shown) each for reading voltage values. On the other hand, source lines 23 are connected to a power line 28. The power line 28 is in turn connected to a write control circuit 29.

In general, a control gate electrode 6 formed common to respective memory cell transistors 20 is used to serve as a word line 21, while an aluminum line 10 connected to the first diffusion layer 7 is used to serve as a source line 22. The first diffusion layer 8 extending in parallel to the control gate electrode 6 is used to serve as a source line 23.

Row selection information LS1 to LS4 are generated based on row address information. Selection of one word line 21 referring to the low selection information LS1 to LS4 will activate a specific row of memory cell transistors 20. Column selection signals CS1 to CS4 are generated based on column address information. Turning on one selection transistor 24 referring to the column selection information CS1 to CS4 will activate a specific column of memory cell transistors 20. With this arrangement, one of a number of memory cell transistors arranged in rows and columns is designated according to row and column address information, and connected to the data line 25.

For writing analog information into a memory cell register 20, application of electric charges (write) and assurance of an applied amount of electric charges (read) are repeatedly conducted in a short cycle in order to improve recording accuracy. That is, data is being written into a memory cell transistor 20 while data is being read therefrom, and a read operation is halted when the content of data just read matches the content of data to be stored.

Figure 4:
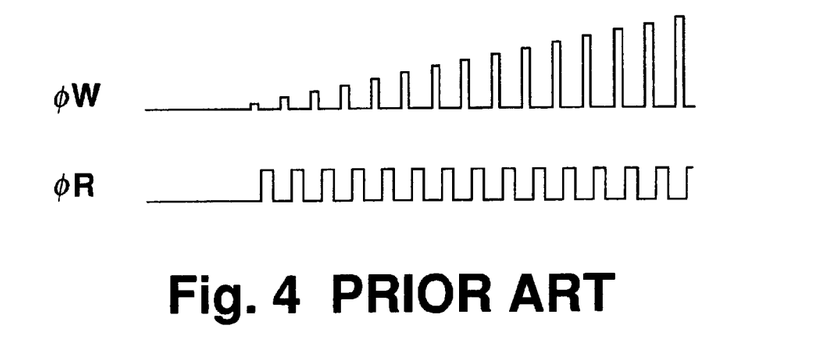
FIG. 4 is a diagram illustrating waveforms of write and read clocks.

A write clock φw rises in a constant cycle only for a constant time period, whose pulse height becomes higher as time passes, as shown in FIG. 4. Outputted by the write control circuit 29, a write clock φw passes through the power line 28 and the source line 23, and is supplied to a memory cell transistor 20. At this time, the electric potential of the data line 25 is decreased in synchronism with the write clock φw, becoming as low as the ground potential. As a result, a current flows from the source line 23 via a selected memory cell transistor 20 to the it line 22 during a period when a write clock φw remains risen, hereby electric charges are applied to a floating gate electrode 4.

On the other hand, a read clock φw rises while a write clock φw is not, whose pulse height remains unchanged. Outputted by the read clock circuit 27, a read clock φ passes through the resistance 26 and the bit line 20, and is supplied to a selected memory cell transistor 20. At this time, the electric potential of the power line 28 is decreased in synchronism with a read clock φr, becoming as low as the ground potential. As a result, a current flows through the resistance 26, the data line 25, a selected memory cell transistor 20, to the power line 28. The electric potential of the bit line 22 is then varied to take the value in accordance with the ratio between the resistance value of the memory cell transistor 20 and the resistance value of the resistor 26. This potential variation is detected by a sense amplifier connected to the bit line 22 so that write and read operations are repeatedly conducted until the electric potential value just read matches the value corresponding to the information to be written in the memory cell transistor 20.

As described above, in the above memory device, since the result of a read operation is set corresponding to an analog value to be stored (i.e., a write operation is conducted while comparing the data to be written and the data just read), the memory device is unlikely to be affected by the inconsistent characteristics of memory cell transistors 20.

However, the write control circuit 29 which generates a write clock φw with increasing pulse height as time passes requires a high voltage power source and a circuit structure capable of controlling a high voltage. In controlling a high voltage, a switching element having sufficient driving capability and tolerance is generally needed. Thus, such a circuit resultantly has a complicated structure, and tends to be affected by power source noises and cause erroneous judgement of stored information.

SUMMARY OF THE INVENTION

The present invention has been conceived to overcome the above problems and aims to provide a circuit having a simple structure for writing analog values and to improve the speed and accuracy of a write operation.

In order to achieve the above object, according to the present invention, there is provided a non-volatile semiconductor memory device, comprising a memory cell transistor including an insulated floating gate electrode in which a charge is stored, and varying a resistance value thereof, when enabled, according to an amount of electric charges stored in the floating gate electrode; a source line connected to the memory cell transistor on a source side; a bit line connected to the memory cell transistor on a drain side; and a current limitation circuit connected to the bit line, stepwise varying a current capacity thereof, wherein the current limitation circuit stepwise increases a current capacity thereof in a predetermined cycle when electric charges are applied to the floating gate electrode of the memory cell transistor by supplying a current to the memory cell transistor through creation of a constant potential difference in a constant cycle between the source line and the current limitation circuit.

According to the present invention, the amount of a write current floating into a memory cell transistor can be stepwise increased by stepwise increasing the current capacity of an electric control circuit, and a constant voltage for a write clock remains constant. With this arrangement, the write control circuit which generates a write clock does not need to conduct high voltage control, and thus achieves sufficient capability with a simple structure.

BRIEF DESCRIPTION OF THE DRAWINGS

The above and the other objects, features, and advantages of the present invention, will become further apparent from the following description of the preferred embodiment taken in conjunction with the accompanying drawings wherein.

DESCRIPTION OF THE PREFERRED EMBODIMENTS

Embodiment 1

Figure 5:
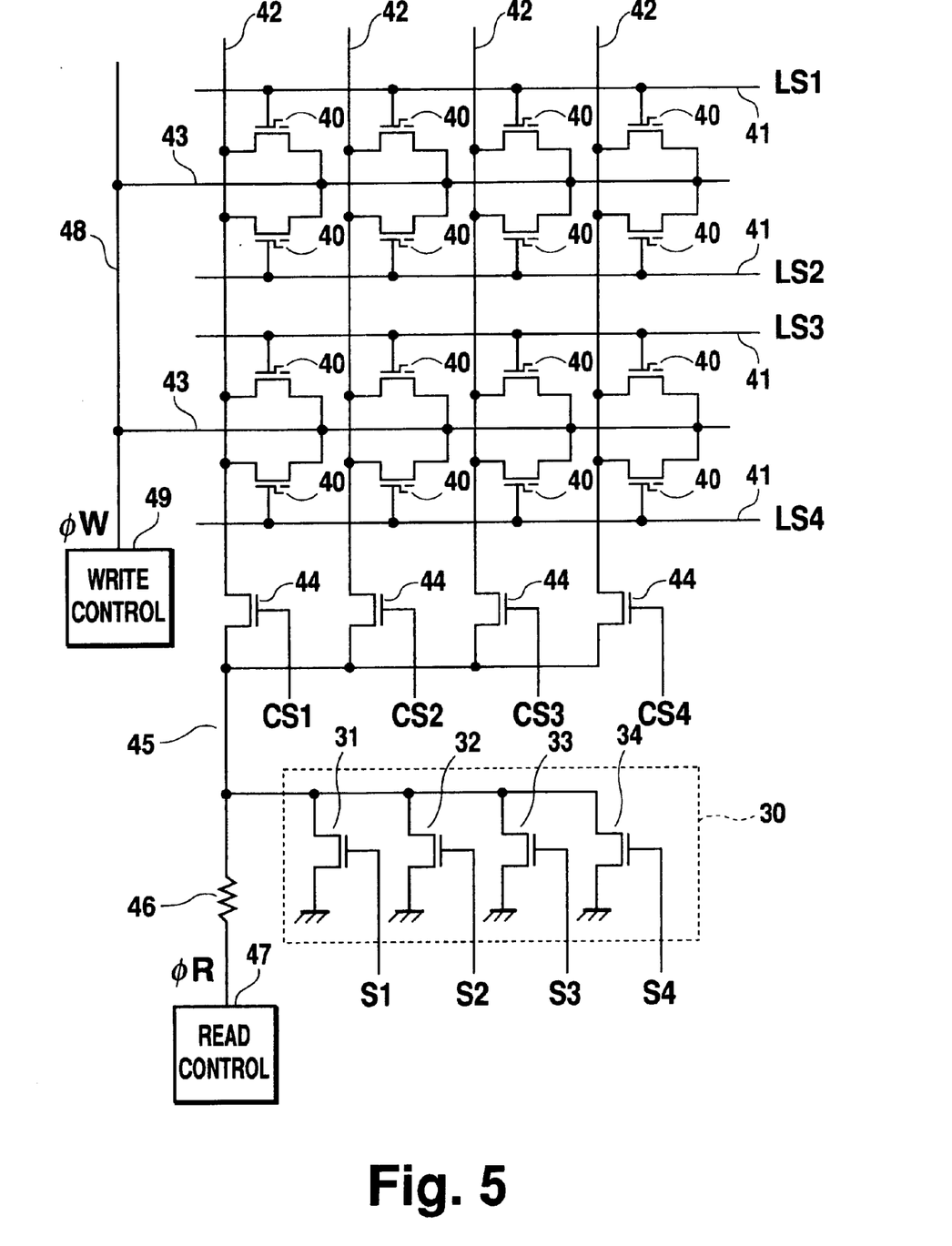
FIG. 5 is a diagram illustrating a circuit structure of a non-volatile semiconductor memory device according to a first preferred embodiment of the present invention.

FIG. 5 is a diagram showing a circuit structure of a non-volatile semiconductor memory device according to a first preferred embodiment of the present invention.

The structure of each memory cell transistor 40 is identical to that of the memory cell transistor 20 of FIG. 3, comprising a floating gate electrode and a control gate electrode. Respective memory cell transistors 40 change a resistance value according to the amount of electric charges applied to the floating gate electrode, as was described for transistors 20.

One word line 41 is provided for each row of the memory cell transistors 40, and is connected to the respective transistors 40 of the corresponding row via their control gate electrodes. The word lines 41 receive row selection signals LS1 to LS 4 from a row decoder (not shown) which in turn receives row selection information. By selecting one row of memory cell transistors 40 with reference to the row selection signals LS1 to LS4, the selected one row is activated.

Bit lines 42 extend along respective columns of the memory cell transistors 40, and are connected to the memory cell transistors 40 of the corresponding column via their drain sides. source lines 43 extend intersecting the bit lines 42, and are connected to the memory cell transistors 40 via their source sides. In this arrangement, memory cell transistors 40 are connected in parallel to the bit lines 42, and receive predetermined electric potentials from the bit lines 42 and the source line 43 for write and erase operations.

The bit lines 42 are also connected to a data line 45 via column selection transistors 44 which operate in response to column selection information CS1 to CS4. The data line 45 is connected on its other side to a read control circuit 47 via a read resistance 46 having a constant resistance value, and also grounded via a current limitation circuit 30.

The respective source lines 43 are connected to a power line 48, which is in turn connected to a write control circuit 49.

The read control circuit 47 generates a read clock φr, and applies a constant voltage to a selected memory cell transistor 40 via the resistor 46, the data line 45, and the bit line 42 in a constant cycle. A read clock φr is identical to that of FIG. 4 and maintains a constant level and a constant cycle according to a write clock φw.

Figure 6:
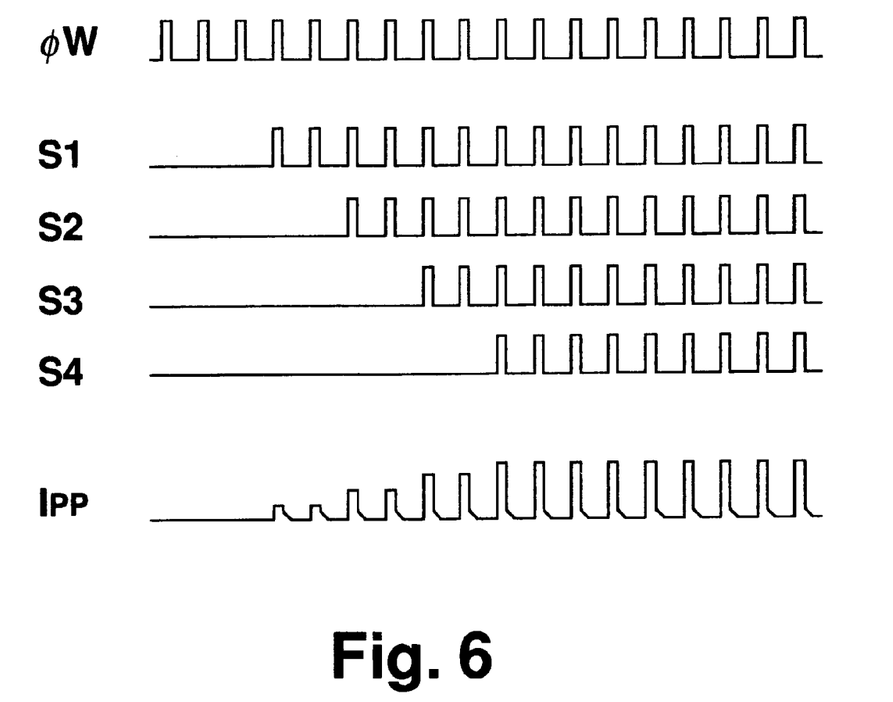
FIG. 6 is a diagram explaining an operation timing of the non-volatile semiconductor memory device according to the first preferred embodiment of the present invention.

The write control circuit 49, on the other hand, generates a write clock φw and applies a constant voltage to a selected memory cell transistor 40 via the power line 48 and the source line 43. A write clock φw rises in a constant cycle while maintaining a constant level, as shown in FIG. 6. A write clock φw has an identical cycle to that of the write clock φw shown in FIG. 4.

In a write operation, the current limitation circuit 30 grounds the data line 45, so that a write current IPP flows from the source line 43 via a selected memory cell transistor 40 to the bit line 42 in response to a write clockφW supplied to the power line 48. The write current IPP further flows into the gate electrode line 45 and then to the current limitation circuit 30.

By the way, the circuit 30 comprises, for instance, four switching transistors 31 to 34 of the same size arranged in parallel to one another between the gate electrode line 45 and the grounding points. The circuit 30 carries out a stepwise control to the incoming write current IPP in response to current control signals S1 to S4 supplied to the respective switching transistors 31 to 34.

Note that the current control signals S1 to S4 stepwise rise in synchronism with a write clock φw having a predetermined clock interval, as shown in FIG. 6. These signals S1 to S4 are generated by delaying clocks supplied from a generation source which also supplies write clocks φw, in a stepwise manner in an appropriate cycle.

With a write clock φw having a constant level, the amount of a write current IPP increases as more current control signals among the current control signals S1 to S4 rise, as shown in FIG. 6. When the signals S1 to S4 have all risen and the switching transistors 31 to 34 have all thus been turned on, the maximum amount of a write current IPP flows and remains constant thereafter.

Figure 7:
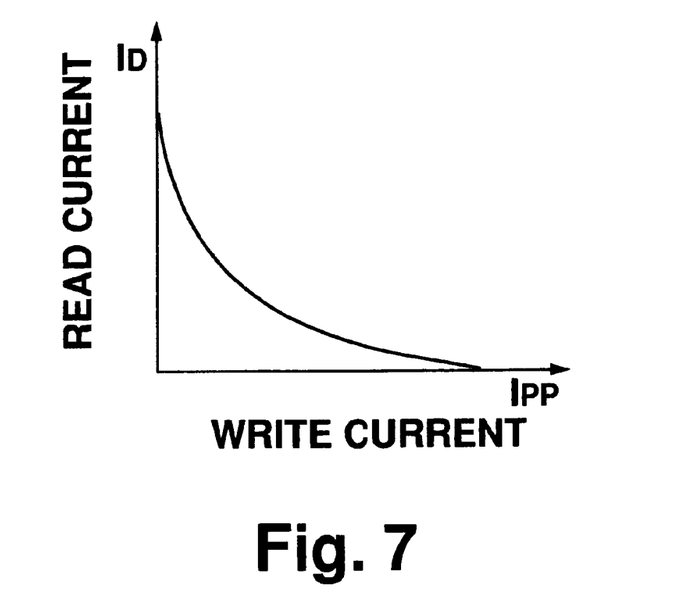
FIG. 7 is a diagram showing characteristics of the relationship between write and read current.

FIG. 7 shows the variation of a read current ID (i.e., a current floating between the source region and the drain region in a read operation) relative to a write current IPP when a write clock φw is supplied during a predetermined time period. Given at the same write voltage and for the same write time period, the amount of a read current ID decreases as the amount of a write current IPP increases. For a larger amount of write current IPP, a larger amount of electric charges are supplied to a memory cell transistor 40 during a unit time. That is, electric charges of different amounts are supplied to a memory cell transistor 40 for write current IPP of different amounts. Thus, different information can be written into a memory cell transistor by supplying a write current IPP of different amounts to the memory cell transistor.

Therefore, the advantage conventionally achieved by stepwise increasing the pulse height of a write clock φw can be achieved in this embodiment by varying the amount of a write current IPP. Thus, since a write clock φw always has a constant level, high voltage control by the write control circuit 49 becomes unnecessary.

It should be noted that although the above current limitation circuit 30 comprises four writing transistors 31 to increase a write current IPP by four steps, a current limitation circuit 30 may comprise more than four switching transistors connected in parallel to increase the current IPP at more than four steps. Further, the current IPP may be increased in any clock φcycle, not just two as described above.

According to the above embodiment, an arrangement in which a write current is stepwise increased while a write voltage remains constant enables writing analog information into a memory cell transistor in a short time. Moreover, since a write control circuit does not need to conduct a high voltage control, the circuit is fully capable with a simple structure, and less affected by power source noises. Moreover, the operation of such a write control circuit is relatively stable, causing only smaller writing errors.

Embodiment 2

Figure 8:
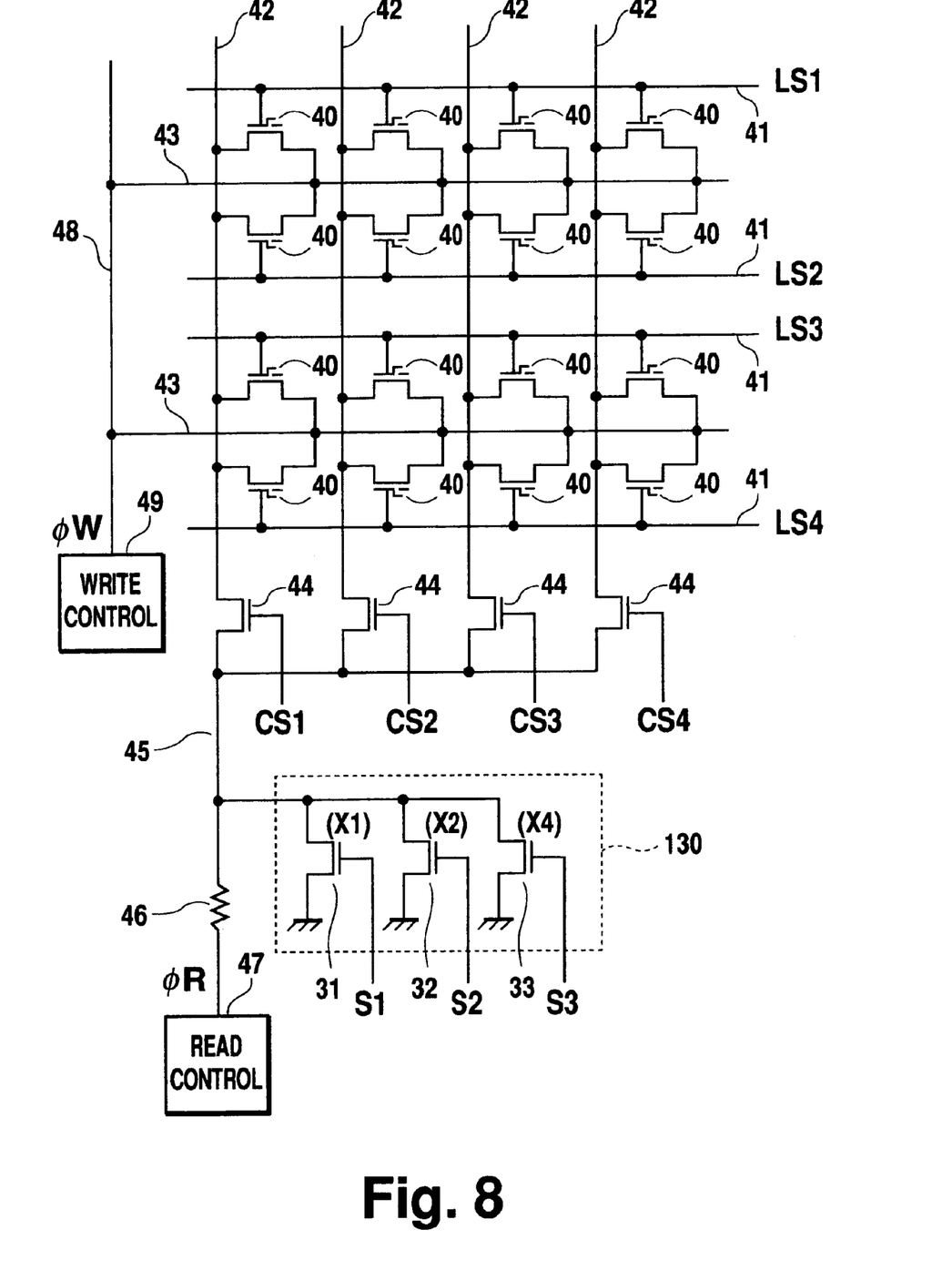
FIG. 8 is a diagram showing a circuit structure of a non-volatile semiconductor memory device according to a second preferred embodiment of the present invention.

FIG. 8 is a diagram showing a circuit structure of a non-volatile semiconductor memory cell according to a second preferred embodiment of the present invention. Corresponding elements to those described for the first embodiment are given identical reference numbers, and their explanation is not repeated.

The difference of a device of this embodiment from that of the first embodiment lies in the structure of a current limitation circuit 130.

Specifically, the circuit 130 comprises, for instance, three switching transistors 131 to 133 connected in parallel between the gate electrode line 45 and the grounding points. The switching transistors 131 to 133 have current capacities respectively weighed by one time, two times, and four times.

Similar to the first embodiment, the current limitation circuit 130 grounds the data line 45 in a write operation, so that a write current IPP flows from the source lines 43 via a selected memory cell 40 to the bit lines 42 in response to a write clock φw supplied to the power line 48. The write current IPP further flows to the gate electrode line 45 and then to the current limitation circuit 130. Then, the circuit 130 turns on the switching transistor 131 to 133 in response to current control signals S1 to S3 which selectively rise in synchronism with a write clock φW, as shown in FIG. 9, and gives stepwise control to the incoming write current IPP floating toward the grounding point.

Note that the current control signals S1 to S3 can be obtained from an output of a three-bit binary counter which operates according to a clock obtained by dividing a clock generated by a generation source which also generates a write clock φW.

Figure 9:
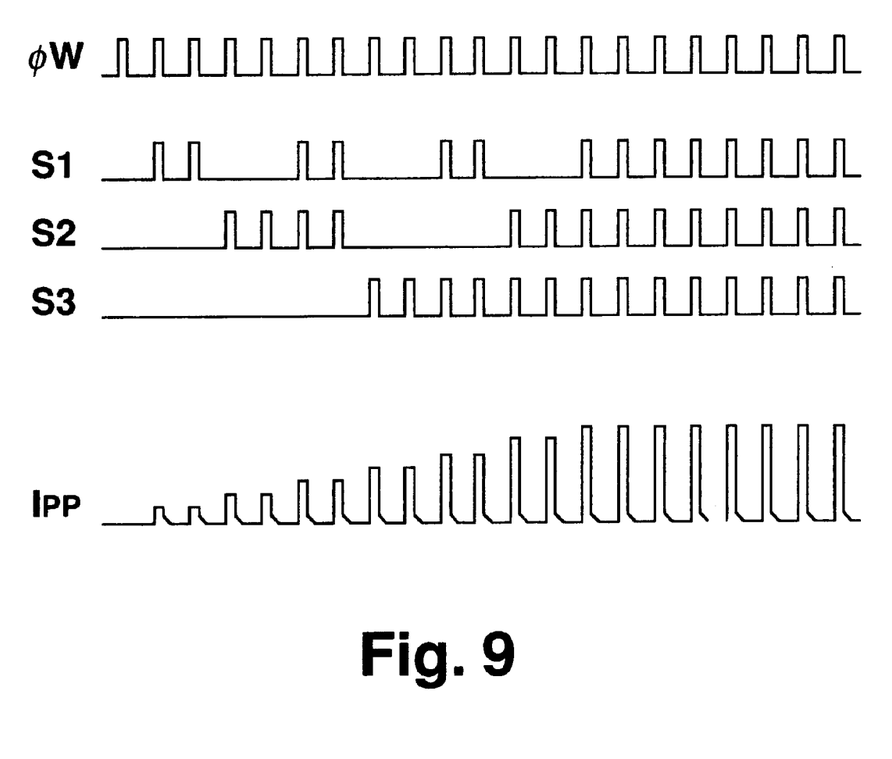
FIG. 9 is a diagram explaining an operation timing of the non-volatile semiconductor memory device according to the second preferred embodiment of the present invention.

Since the respective switching transistors 31 to 33 have capacities weighed by $2^n$ times, the amount of a write current IPP is increased in a stepwise manner for every two cycles, as shown in FIG. 9. A pulse height for a write clock φw remains constant. When the signals S1 to S3 have all risen and the switching transistors 131 to 133 have all thus been turned on, the maximum amount of a write current IPP flows and the amount remains thereafter.

The correlation between a write current IPP and a read current ID in this embodiment is identical to that in the first embodiment, as shown in FIG. 7. Therefore, the device of this embodiment can also achieve the aforementioned conventional advantage while maintaining a constant level for a write clock φw. In other words, the device of this embodiment does not need high voltage control by the write control circuit 49, similar as in the first embodiment.

It should be noted that although the above current limitation circuit 130 comprises three writing transistors 131 to 133 to increase a write current IPP by seven steps, a current limitation circuit 130 may comprise more than three switching transistors connected in parallel in order to increase the current IPP by more than seven steps. Further, the current IPP may be increased in any clock cycles, not just two as described above.

In addition to the above advantage, this embodiment also achieves the following advantage.

That is, the current limitation circuit comprises switching transistors whose current capacities are weighed by $2^n$ times, and can thus effectively increase a write current in a stepwise manner by utilizing combination of the switching transistors without increasing the number of switching transistors involved. Accordingly, the number of current control signals each corresponding to each switching transistor does not need to be increased even in the case of conducting multiple-step increase of a write current. Therefore, a current control circuit with a simple structure is fully capable of generating a necessary number of current control signals for multiple-step increase of a write current. In other words, a current control circuit of a complicated structure can be avoided.

While there have been described what are at present considered to be preferred embodiments of the present invention, it will be understood that various modifications may be made thereto, and it is intended that the appended claims cover all such modifications as fall within the true spirit and scope of the invention.

What is claimed is:

1. A non-volatile semiconductor memory device, comprising:
    a memory cell transistor including an insulated floating gate electrode in which a charge is stored, and varying a resistance value thereof, when enabled, according to an amount of electric charges stored in the floating gate electrode;
    a source line connected to the memory cell transistor on a source side;
    a bit line connected to the memory cell transistor on a drain side; and
    a current limitation circuit connected to the bit line, stepwise varying a current capacity thereof, wherein the current limitation circuit stepwise increases the current capacity thereof in a predetermined cycle when electric charges are applied to the floating gate electrode of the memory cell transistor by supplying a current to the memory cell transistor through generation of a constant potential difference between the source line and the current limitation circuit.

2. A non-volatile semiconductor memory device according to claim 1, wherein
    the current limitation circuit includes a number of switching transistors connected in parallel between the bit line and grounding points, and turns on the number of switching transistors in response to a number of current control signals,
    the number of current control signals sequentially rising in synchronism with a write clock for every a predetermined clock period,
    the write clock having a constant level and being applied to the source line.

3. A non-volatile semiconductor memory device according to claim 1, wherein
    the current limitation circuit includes a number of switching transistors connected in parallel between the bit line and grounding points,
    the number of switching transistors having current capacities increasing at predetermined times steps.

4. A non-volatile semiconductor memory device according to claim 3, wherein
    the current limitation circuit turns on the number of switching transistors in response to a number of current control signals,
    the number of current control signals sequentially rising in synchronism with a write clock for every a predetermined clock period,
    the write clock having a constant level and being applied to the source line.

5. A non-volatile semiconductor memory device, comprising:
    a memory cell transistor including an insulated floating gate electrode in which a charge is stored, and varying a resistance value thereof according to an amount of electric charges stored in the floating gate electrode;
    a source line connected to the memory cell transistor on a source side;
    a bit line connected to the memory cell transistor on a drain side; and
    a current limitation circuit including a number of switching transistors connected in parallel between the bit line and the grounding point.

6. A non-volatile semiconductor memory device according to claim 5, wherein the switching transistors have substantially equal current handling capacity and at least one of switching transistors is turned on/off in response to a different current control signal.

7. A non-volatile semiconductor memory device according to claim 5, wherein
    the number of switching transistors includes n number of switching transistors,
    current capacity of each of the n number of switching transistors can be expressed by a progression $\{\alpha^k\}$, where $\alpha$=any constant and k=a unique integer between 0 to n−1, and
    each of the n number of switching transistors is turned on/off in response to a different current control signal.

8. A method for writing information to a non-volatile semiconductor memory device, comprising the steps of:
    providing a memory cell transistor including an insulated floating gate electrode in which a charge is stored, and varying a resistance value thereof according to an amount of electric charges stored in the floating gate electrode;
    connecting a source line to the memory cell transistor on a source side;
    connecting a bit line to the memory cell transistor on a drain side; and
    providing a current limitation circuit, which includes a number of switching transistors connected in parallel and driven by a current control signal, between the bit line and the grounding point, wherein the current limitation circuit includes n number of switching transistors, current capacity of each of the n number of switching transistors being expressed by a progression $\{\alpha^k\}$, where $\alpha$=any constant and k=a unique integer between 0 to n−1, and each one of the n number of switching transistors is turned on/off in response to the current control signal.

9. A method for writing information to a non-volatile semiconductor device according to claim 8, comprising a step of:
    applying a write clock having a constant level into the source line until electric charges of an amount according to information for recording are stored in the floating gate electrode;
    wherein the current control signal for tuning on/off a switching transistor corresponding to a term $\alpha^k$(k=1 to n−1) of the progression $\{\alpha^k\}$, is switched between an off level keeping the switching transistor in an off state and an on level keeping the switching transistor in an on state for every cycle of a current signal for turning on/off a switching transistor corresponding to a term $\alpha^{k-1}$(k=1 to n−1) of the progression $\{\alpha^k\}$.

10. A method for writing information to a non-volatile semiconductor memory device, comprising the steps of:

providing a memory cell transistor including an insulated floating gate electrode in which a charge is stored, and varying a resistance value thereof according to an amount of electric charges stored in the floating gate electrode;

connecting a source line to the memory cell transistor on a source side;

connecting a bit line to the memory cell transistor on a drain side; and providing a current limitation circuit, which includes a number of switching transistors connected in parallel and driven by current control signals, between the bit line and the grounding point, wherein each one of the switching transistors has substantially equal current capacity and is turned on/off in response to the current control signals.

11. A method for writing information to a non-volatile semiconductor device according to claim 10, comprising steps of:

applying a write clock having a constant level into the source line until electric charges of an amount according to information for recording, are stored in the floating gate electrode; and sequentially raising a number of current control signals in synchronism with the write clock to accumulatively turn on the number of switching transistors having identical current capacities.

12. A non-volatile semiconductor memory device, comprising:

a memory cell transistor including an insulated floating gate electrode in which a charge is stored, and varying a resistance value thereof, when enabled, according to an amount of electric charges stored in the floating gate electrode;

a source line connected to the memory cell transistor on a source side;

a bit line connected to the memory cell transistor on a drain side; and a current limitation circuit connected to the bit line, stepwise varying a current capacity thereof, having a current capacity smaller than the current capacity of the memory cell transistor, wherein the current limitation circuit stepwise increases the current capacity thereof in a predetermined cycle when electric charges are applied to the floating gate electrode of the memory cell transistor by supplying current to the memory cell transistor through generation of a constant potential difference between the source line and the current limitation circuit, and wherein the current limitation circuit includes a number of switching transistors connected in parallel between the bit line and grounding points, the number of switching transistors having current capacities increasing at predetermined times steps.

13. A non-volatile semiconductor memory device according to claim 12, wherein the current limitation circuit turns on the number of switching transistors in response to a number of current control signals, the number of current control signals sequentially rising in synchronism with a write clock for every a predetermined clock period, the write clock having a constant level and being applied to the source line.

* * * * *